(12) United States Patent
Kim et al.

(10) Patent No.: US 9,069,258 B2
(45) Date of Patent: Jun. 30, 2015

(54) MASK HAVING ASSIST PATTERN

(71) Applicant: Samsung Display Co., LTD., Yongin-si, Gyeonggi-do (KR)

(72) Inventors: Bong-Yeon Kim, Seoul (KR); Min Kang, Seoul (KR); Seung-Bo Shim, Asan-si (KR); Jong-kwang Lee, Daejeon (KR); Jin-Ho Ju, Seoul (KP); Jeong-Won Kim, Suwon-si (KR); Tae-Gyun Kim, Yongin-si (KR); Chul-Won Park, Gwangmyeong-si (KR); Jun-Hyuk Woo, Yongin-si (KR); Hyun-Joo Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 228 days.

(21) Appl. No.: 13/835,567

(22) Filed: Mar. 15, 2013

(65) Prior Publication Data
US 2013/0316270 A1    Nov. 28, 2013

(30) Foreign Application Priority Data

May 22, 2012   (KR) .......................... 10-2012-0054485

(51) Int. Cl.
*G03F 1/42*    (2012.01)

(52) U.S. Cl.
CPC ....................................... *G03F 1/42* (2013.01)

(58) Field of Classification Search
CPC ......... G03F 1/36; G03F 1/44; G03F 7/70475; G03F 1/42
USPC .............................................. 430/5, 311, 394
See application file for complete search history.

(56) References Cited

U.S. PATENT DOCUMENTS

| | | | | |
|---|---|---|---|---|
| 2005/0003305 A1* | 1/2005 | Hashimoto et al. | ........... | 430/311 |
| 2009/0176069 A1* | 7/2009 | Yang et al. | ................. | 428/195.1 |

FOREIGN PATENT DOCUMENTS

| | | | |
|---|---|---|---|
| JP | 2003-255508 A | | 9/2003 |
| KR | 1996-0005749 A | | 2/1996 |
| KR | 10-0827459 B1 | | 4/2008 |

\* cited by examiner

*Primary Examiner* — Stephen Rosasco
(74) *Attorney, Agent, or Firm* — Cantor Colburn LLP

(57) ABSTRACT

A mask may include a circuit area and a pixel area. The circuit area includes a circuit pattern. The pixel area includes a pixel pattern which is extended in a length direction and an assist pattern which is at an end portion of the pixel pattern and adjacent to the circuit area.

12 Claims, 13 Drawing Sheets

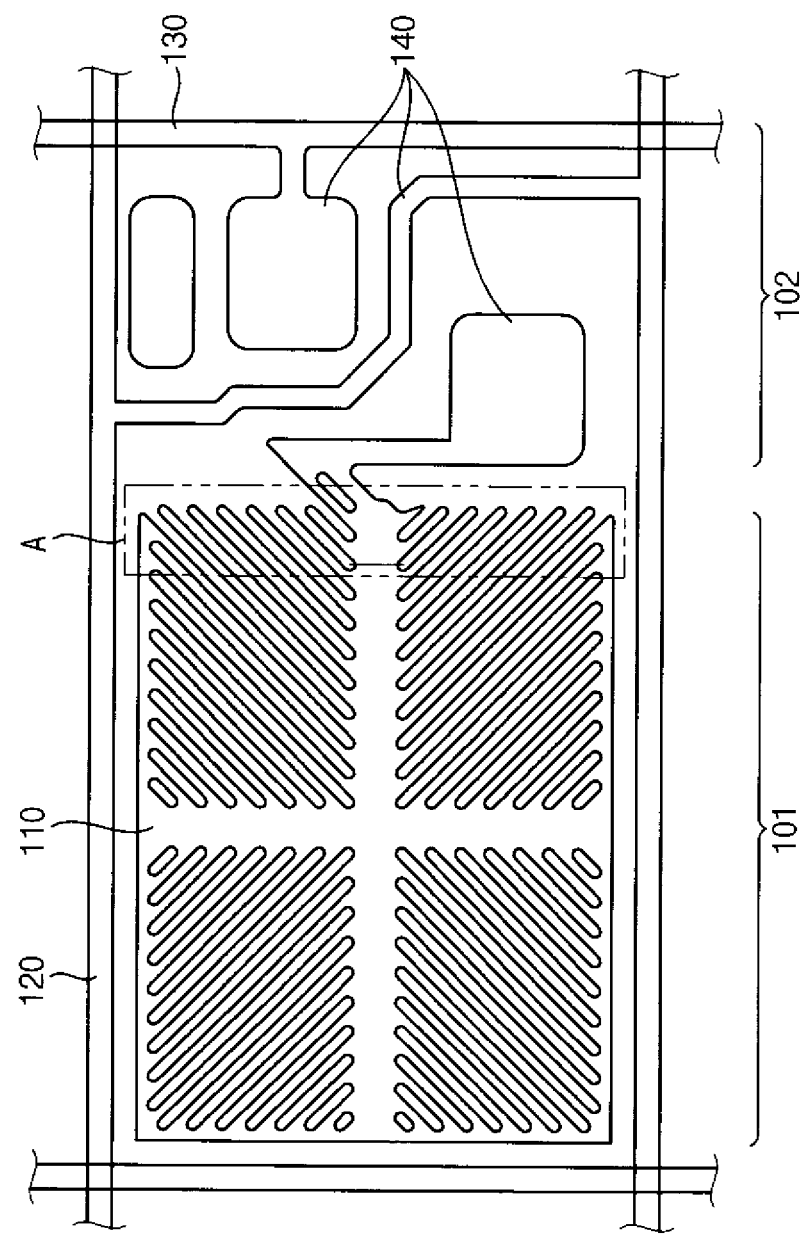

MASK HAVING ASSIST PATTERN

This application claims priority to Korean Patent Application No. 10-2012-0054485, filed on May 22, 2012, and all the benefits accruing therefrom under 35 U.S.C. §119, the contents of which are herein incorporated by reference in their entireties.

BACKGROUND

1. Field

Exemplary embodiments of the invention relate to a mask having an assist pattern. More particularly, exemplary embodiments of the invention relate to a mask having an assist pattern capable of preventing a texture defect.

2. Description of the Related Art

A driving method of various liquid crystal display apparatuses has been illustrated. When a liquid crystal apparatus displays an image using different transmittance with respect to a light as a result of an electric field generated within the liquid crystal apparatus, a gap of response time and viewing angle is generated as liquid crystal is aligned within the liquid crystal apparatus. Thus, a driving method of various liquid crystal display apparatuses has been developed for driving a liquid crystal display apparatus having a more improved response time and viewing angle.

Generally, in one of method of driving a liquid crystal display apparatus, liquid crystal is aligned by an electric field formed with respect to one substrate, different from a conventional method of driving a liquid crystal display apparatus. In the conventional method, liquid crystal is aligned by an electric field with respect to two substrates, such as a top and bottom substrate. The electric field which is formed with respect to one substrate may control a direction of liquid crystal molecules in a liquid crystal layer of the liquid crystal display apparatus. Since an electric field is formed with respect to one substrate, such as a bottom substrate, a pixel pattern of a second substrate, such a top substrate, is not needed for controlling arrangement of the liquid crystal layer, a manufacturing process of a liquid crystal display apparatus is simplified, and misalignment of a top substrate and a bottom substrate is reduced or effectively prevented. A transmittance of a liquid crystal display apparatus using an electric field with respect to one substrate is 25% greater than a conventional liquid crystal display apparatus using an electric field with respect to more than one substrate. Thus, a range of application for the liquid crystal display apparatus using on substrate has been expanded.

When arrangement of the liquid crystal layer is controlled by only a plurality of pixel electrodes on a single bottom substrate of a liquid crystal display apparatus, if a pattern of the pixel electrode is not correctly formed, a defect in the arrangement of the liquid crystal arrangement used for displaying images is generated, for example, a texture defect of a portion in one pixel is generated. There are a number of causes of the texture defect. Particularly, a problem of the texture defect is generated in the pixel electrode. When the pixel electrode is adjacent to a common circuit area of the liquid crystal display apparatus, materials for forming the pixel electrode are over exposed in a process of forming the liquid crystal display apparatus. When portions of the pixel electrode adjacent to the common circuit area are over exposed, the pixel electrode is imperfectly formed. Thus, an overall defect is generated in the liquid crystal display apparatus, and quality with respect to an overall pixel performance is decreased.

SUMMARY

Exemplary embodiments of the invention provide a mask having an assist pattern capable of reducing or effectively preventing a texture defect in a pixel of a display apparatus.

In an exemplary embodiment, a mask includes a circuit area and a pixel area. The circuit area includes a circuit pattern, and a pixel area includes a pixel pattern extended in a length direction and an assist pattern adjacent to the circuit area area. The assist pattern is at an end portion of the pixel pattern.

In an exemplary embodiment, the assist pattern may be extended from the end portion of the pixel pattern.

In an exemplary embodiment, the assist pattern may include at least two sub-assist patterns extended from the end portion of the pixel pattern.

In an exemplary embodiment, the at least two sub-assist patterns may be extended from corners of the pixel pattern.

In an exemplary embodiment, each of the sub-assist patterns may include a square shape.

In an exemplary embodiment, a center of the square shape of the sub-assist pattern may be on an extension line extended in the length direction of the pixel pattern.

In an exemplary embodiment, twice a length of a side of the square shape of the sub-assist pattern may be substantially equal to or smaller than about 75% of a width of the pixel pattern.

In an exemplary embodiment, twice a length of a side of the square of the sub-assist pattern may be substantially equal to or greater than about 50% of a width of the pixel pattern and may be substantially equal to or smaller than about 70% of the width of the pixel pattern.

In an exemplary embodiment, the sub-assist pattern may be integral with the pixel pattern.

In an exemplary embodiment, a width of the assist pattern may be greater than a width of the pixel pattern.

In an exemplary embodiment, a height of the assist pattern extended in the length direction of the pixel pattern may be about 1/10 to about 1/4 the width of the pixel pattern.

In an exemplary embodiment, the width of the assist pattern may be greater than the width of the pixel pattern by about 1/10 to about 1/4 the width of the pixel pattern.

In an exemplary embodiment, the assist pattern may be integral with the pixel pattern.

In an exemplary embodiment, the assist pattern may be spaced apart from the end portion of the pixel pattern by a first distance.

In an exemplary embodiment, a width of the assist pattern may be substantially equal to a width of the pixel pattern.

In an exemplary embodiment, a height of the assist pattern extended in the length direction of the pixel pattern may be substantially equal to the first distance.

In an exemplary embodiment, the height of the assist pattern may be about 1/10 to about 1/4 the width of the pixel pattern.

In an exemplary embodiment, the assist pattern may be extended from a side of the pixel pattern.

In an exemplary embodiment, a thickness of the assist pattern may increase, as a distance from the end portion of the pixel pattern may be decreased.

In an exemplary embodiment, a thickness of the assist pattern may be discontinuously increased, as a distance from the end portion of the pixel pattern may be decreased.

According to one or more exemplary embodiment of the invention, an assist pattern of a mask disposed at an end portion of a pixel pattern of the mask and disposed adjacent to a circuit area blocks light from being incident into a pixel area adjacent to the circuit area. Thus, an end portion of a pixel pattern of a display apparatus may be easily designed to have a proper shape by using the mask having both the assist pattern and the pixel pattern.

BRIEF DESCRIPTION OF THE DRAWINGS

The above and other features and advantages of the invention will become more apparent by describing in detailed exemplary embodiments thereof with reference to the accompanying drawings, in which;

FIG. 2 is a plan view illustrating an exemplary embodiment of portions of a mask with respect to a pattern formed using the mask, according to the invention;

DETAILED DESCRIPTION

Figure 1A:
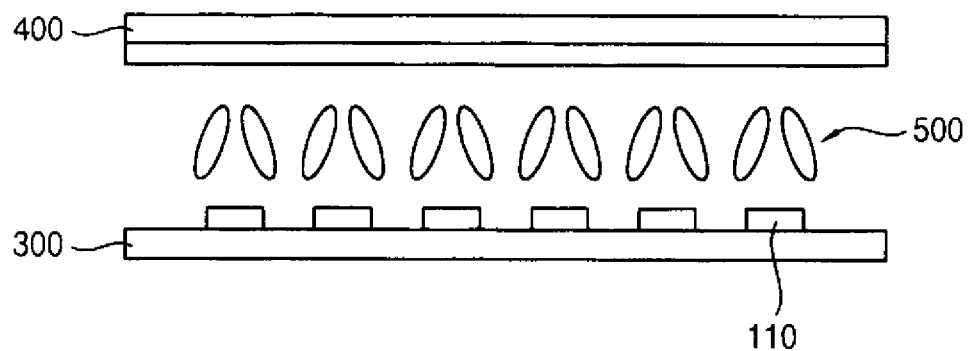
FIGS. 1A and 1B are cross-sectional views illustrating an exemplary embodiment of a method of driving a liquid crystal display apparatus according to the invention.

It will be understood that when an element or layer is referred to as being on or "connected to" another element or layer, the element or layer can be directly on, connected or coupled to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "bottom," "top" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "bottom" relative to other elements or features would then be oriented "top" relative to the other elements or features. Thus, the exemplary term "bottom" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," an and the are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the invention will be described in detail with reference to the accompanying drawings.

Figure 1B:
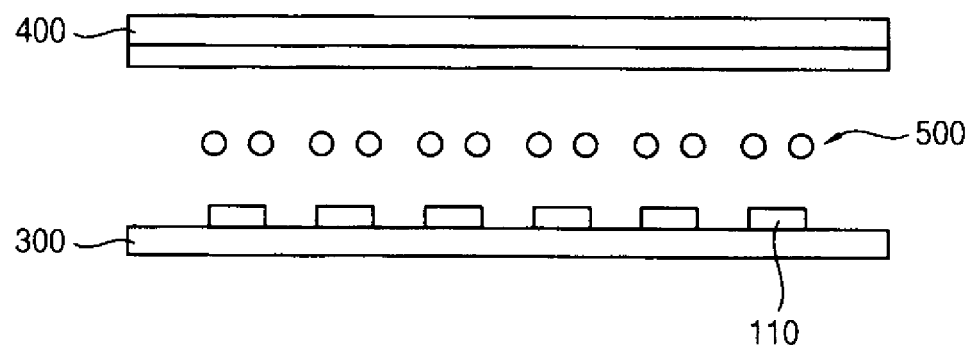

FIGS. 1A and 1B are cross-sectional views illustrating an exemplary embodiment of a method of driving a liquid crystal display apparatus according to the invention. A liquid crystal display apparatus may include a first (e.g., bottom) substrate 300, a second (e.g., top) substrate 400, and a liquid crystal layer 500 arranged between the bottom substrate 300 and the top substrate 400. The bottom substrate 300 may include a pixel electrode 110 having a slit pattern. The bottom substrate 300 may include a plurality of pixel electrodes 110. An electric field in the liquid crystal layer 500 is formed from only the pixel electrode 110 of the bottom substrate 300, but is not limited thereto or thereby. In FIG. 1A, an arrangement of liquid crystal within the liquid crystal layer 500 generates a black screen which an electric field is not formed in the liquid crystal layer 500. In FIG. 1B, an arrangement of liquid crystal within the liquid crystal layer 500 generates a white screen when an electric field is formed within the liquid crystal layer 500.

FIG. 2 is a plan view illustrating an exemplary embodiment of portions of a mask with respect to a pattern formed using the mask.

Referring to FIG. 2, a mask may include a pixel area 101 and a circuit area 102, which corresponds to a pixel area 101 and a circuit area 102 of a substrate of a display apparatus, respectively. The pixel area 101 of the mask may include a pixel pattern which is used to form an electrode pattern on the substrate of the display apparatus, and the circuit area 102 of the mask may include a circuit pattern which is used to form a common circuit pattern on the substrate of the display apparatus. In a method of forming a display apparatus, the mask may include a plurality of pixel patterns in the pixel area 101. The mask may be used to selectively irradiate light onto the substrate of the display apparatus to form the electrode and common circuit pattern.

As illustrated in FIG. 2, the pixel area 101 of the substrate may include a pixel electrode 110. In one exemplary embodiment, the pixel electrode 110 may be formed on a bottom substrate of a display apparatus to have a shape which a plurality of slits is arranged (illustrated in FIG. 2) for forming an electric field which may control arrangement of a liquid crystal layer of the display apparatus. The desired slit arrangement of the pixel electrode 110 having this shape may be defined as a U-slit pattern.

The U-slit pattern of the pixel electrode 110 is a pattern which includes a rib-shape, such as a cross-shaped stem pattern from which protruding portions between slits may be extended. The U-slit pattern may further include a surrounding portion around a periphery thereof, which is electrically connected to each of the rib-shaped and slit-shaped portions. Referring to FIG. 2, a single pixel electrode 110 may be in the pixel area 101, but is not limited thereto or thereby.

A closed pattern is substantially formed by the rib-shape or cross-shaped pattern at a center of the pixel electrode 110 and by the surrounding portion. However, an open pattern from which the surrounding portion is absent, is in area of the pixel electrode 110 adjacent to the circuit area 102. That is, distal ends of the ribs adjacent to the circuit area 102 are not connected to each other, and slits between the ribs are open to the circuit area 102. The protruded ribs of the U-slit pattern pixel electrode 110 may desirably include substantially uniform or smoothly formed ends. Thus, when forming the open ribs adjacent to the circuit area 102, material upon which light is irradiated may be over exposed and/or external light may be incident thereon, such that forming electrode and/or common circuit patterns may be interrupted or cause deformation of the patterns from their final designed shapes.

A common circuit pattern in the circuit area 102 of the substrate may include various line patterns 120, 130 and 140 as determined by a design of the bottom substrate which is manufactured by the mask. The common circuit pattern formed in the circuit area 102 includes an exposed area compared to a pattern formed in the pixel area 101. Since the line areas 120, 130 and 140 do not serve in arranging liquid crystal of a liquid crystal layer to form an electric field, unlike the patterns in the pixel area 101 of the substrate, a size of patterns in the circuit area 102 of the substrate may be greater than and less dense than patterns in the pixel area 101. Thus, when forming patterns in the pixel area 101 and the circuit area 102, a transmitting area of the circuit area 102 upon which light is transmitted may be greater than a transmitting area of the pixel area 101. Generally, more light is transmitted to the circuit area 102 than to the pixel area 101.

Referring to FIG. 2, the pixel electrode 110 in the pixel area 101 and adjacent to the circuit area 102 is open as discussed above. A portion of light irradiated into the circuit area 102 may be incident into an area of the pixel electrode 110. Since irradiated light to the circuit area 102 may be incident to the area of the pixel electrode 110, materials for the pixel electrode 110 adjacent to the circuit area 102 may be over exposed to the light, thus not have a properly formed final shape.

Figure 3:
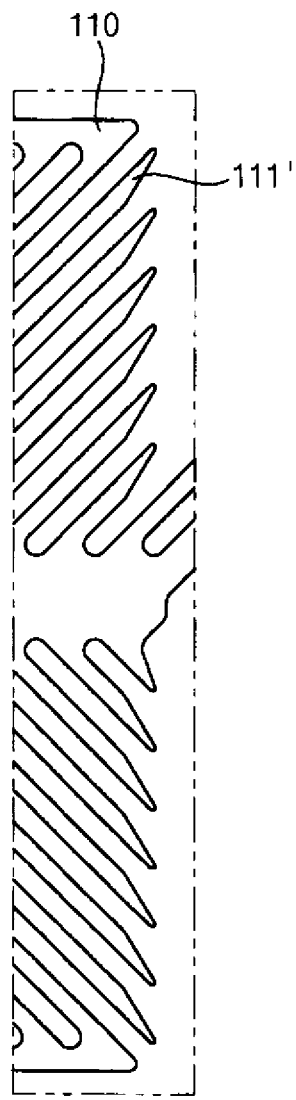
FIG. 3 is an enlarged view illustrating portion "A" of the pattern in FIG. 2 which is formed by exposing a conventional mask.

FIG. 3 is an enlarged view illustrating portion "A" of the pattern in FIG. 2 which is forming by exposing material using a conventional mask.

Referring to FIG. 3, a pixel electrode 110 which formed by exposing material for forming the pixel electrode 110 using a conventional mask not having an assist pattern is over exposed by light irradiated to the adjacent circuit area 102. The circuit area 102 includes a larger light transmitting area on which light is irradiated compared to the pixel area 101. Many transmitting areas are distributed in the circuit area 102 adjacent to the pixel area 101, and consequently a large amount of light is irradiated from the circuit area 102 to an area adjacent to the pixel area 101.

Thus, light having passed through a mask pattern in the circuit area 102 of the mask may leak toward material for forming the pixel electrode 110 by a pixel pattern 111' of the mask that is adjacent to the circuit area 102. The leaked light may over expose the material for forming the pixel electrode 110 adjacent to the circuit area 102 and form a serpentine pattern in which ends are not uniformly or smoothly formed (not the U-slit pattern). As illustrated in FIG. 3, ends of the ribs of the serpentine pattern pixel electrode 110 are undesirably non-uniform. When an electric field for liquid crystal alignment is formed using the serpentine pattern pixel electrode 110, a necessary amount of electric field is not formed by the pixel electrode 110 having a serpentine pattern, and/or an electric field having a different intensity is formed compared to another pixel electrode to which a same signal is applied. Thus, a defect (such as representing another color, etc.) is generated in a pixel area including a pixel electrode 110 having the serpentine pattern.

Figure 4:
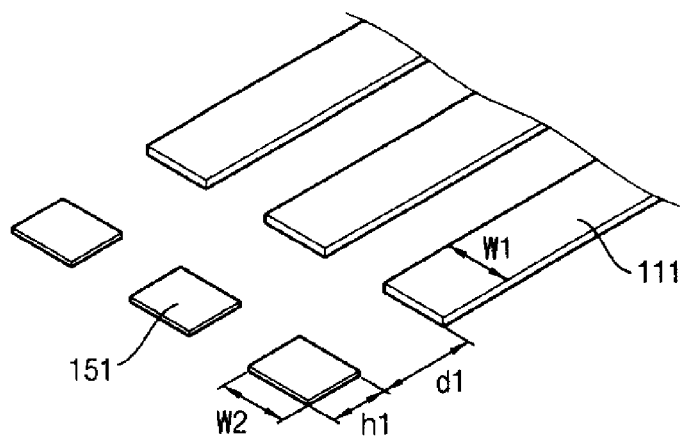
FIG. 4 is a perspective view illustrating an exemplary embodiment of a portion of a mask according to the invention.

FIG. 4 is a perspective view illustrating an exemplary embodiment of a portion of a mask according to the invention.

Referring to FIG. 4, a mask may include an assist pattern 151 on an end portion of a pixel pattern 111 adjacent to the circuit area 102. The mask may include a plurality of assist patterns 151. The pixel pattern 111 may include a longitudinal axis extending in a first direction. The assist pattern 151 is separated by a first distance d1 from an end portion of the pixel pattern 111, in the first direction. The pixel pattern 111 may include a first width w1 taken perpendicular to the longitudinal axis thereof, that is, in a second direction. The assist pattern 151 may include a second width w2 taken in the second direction. The assist pattern 151 is extended at a first height h1 in a length direction of the pixel pattern 111, that is, parallel to the longitudinal axis of the pixel pattern 111. The second width w2 of the assist pattern 151 may be substantially the same or equal to the first width w1 of the pixel pattern 111.

The assist pattern 151 may block a light used in exposing the substrate and materials thereon to form a pixel electrode, a signal line, a circuit pattern, and the like, of a display apparatus. A size of the assist pattern 151 may be smaller than a size of the pixel pattern 111, and a pixel pattern or a circuit pattern of the substrate is not substantially formed by the assist pattern 151. Since only an amount of light provided to a pattern of the mask adjacent to the assist pattern 151 may be reduced, pixel and/or circuit patterns of a display apparatus may be easily designed to have a proper shape by using the assist pattern 151.

The assist pattern 151 is apart by the first distance d1 from an end portion of the pixel pattern 111. A pixel or circuit pattern of the display apparatus is not substantially formed by the assist pattern 151, and the pixel or circuit pattern of the display apparatus is formed from the material at an end portion of the pixel pattern 111 of the mask by using the assist pattern 151. The assist pattern 151 serves to control an amount of light provided to the material at an end portion of the pixel pattern 111 of the mask. Particularly, a light leaked from a circuit area 102 may be blocked by the assist pattern 151. Thus, the assist pattern 151 serves to form a design of an electrode pattern of the display apparatus at an end portion of the pixel pattern 111.

Figure 5:
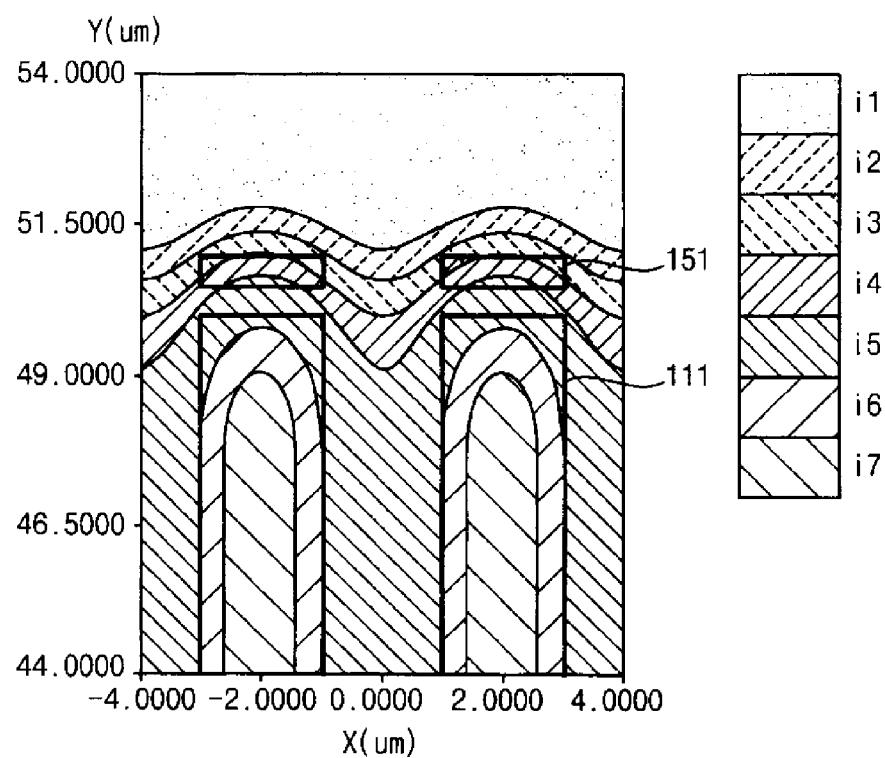
FIG. 5 is a graph illustrating an exposure intensity with respect to the mask shown in FIG. 4.

FIG. 5 is a graph illustrating an exposure intensity of the mask shown in FIG. 4.

Referring to FIG. 5, an exposure intensity of the exemplary embodiment of the mask in FIG. 4 is illustrated. The X and Y axes are dimensions in microns (μm) of ribs of the pixel electrode 110 adjacent to the circuit area 102. FIG. 5 represents an exposure intensity of an exemplary embodiment of a mask according to the invention when the first distance d1 is 0.5 μm, the first height h1 is 0.5 μm, the first width w1 is 2.0 μm and the second width w2 is 2.0 μm.

Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the sixth intensity i6 and the seventh intensity i7. A pixel pattern (e.g., pixel electrode 110) of the substrate is formed to have a U-type pattern (e.g., not a serpentine pattern). Thus, an electric field necessary for liquid crystal arrangement may be substantially the same as other pixel electrode patterns, thus a defect by a pixel electrode pattern may be reduced or effectively prevented.

Figure 6:
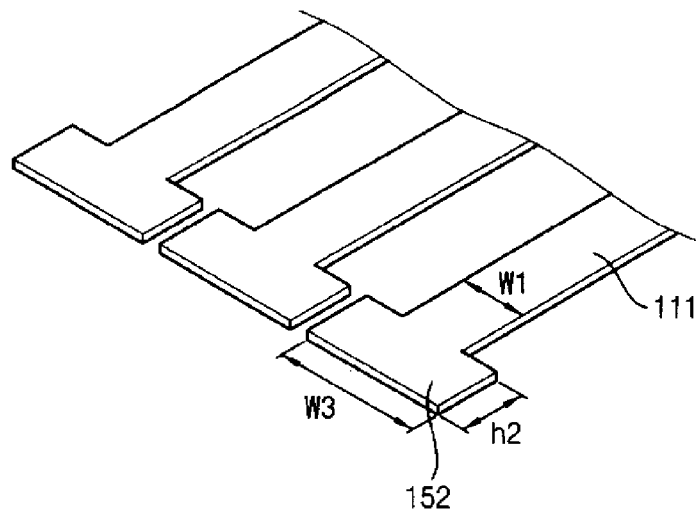
FIG. 6 is a perspective view illustrating another exemplary embodiment of a portion of mask according to the invention.

FIG. 6 is a perspective view illustrating another exemplary embodiment of a portion of mask according to the invention.

Referring to FIG. 6, a mask may include a pixel pattern 111, and an assist pattern 152 extended from the pixel pattern 111. The pixel pattern 111 may include a first width w1. The assist pattern 152 may include a third width w3. The assist pattern 152 is extended at a second height h2 in a length direction of the pixel pattern 111, taken from a distal end of the pixel pattern 111.

The third width w3 of the assist pattern 152 may be greater than a first width w1 of the pixel pattern 111. Since the assist pattern 152 is adjacent to the pixel pattern 111, a third width w3 is greater than a first width w1 of the pixel pattern 111 and an end portion of the pixel pattern 111 may be designed. The assist pattern 152 and the pixel pattern 111 form an overall hammer-shaped pattern in the plan view. A second height h2 of the assist pattern 152 extended in a length direction of the pixel pattern 111 may be about ¹⁄₁₀ to ¼ the first width w1 of the pixel pattern 111. Due to the assist pattern 152 having a longitudinal axis according to the second height h2, an end portion of the pixel pattern 111 is more densely formed. When the second height h2 is too large, an unnecessary pixel or circuit pattern of the display apparatus may be formed at an end portion of the pixel pattern 111 of the mask. Thus, the second height h2 is controlled such that an unnecessary pattern of the display apparatus is not formed on an end portion of the pixel pattern 111.

The third width w3 of the assist pattern 152 may be greater than the first width w1 of the pixel pattern 111. When the third width w3 is too large, an end portion of the pixel or circuit pattern of the display apparatus formed by the pixel pattern 111 may be extended from a side of the pixel pattern 111. When an end portion of the pixel or circuit pattern formed by the pixel pattern 111 is extended from the side, a short-circuit is generated with an adjacent pixel or circuit pattern of the display apparatus formed by the pixel pattern 111. Thus, the third width w3 is controlled such that a short-circuit is not generated with an adjacent pixel or circuit pattern of the display apparatus. A third width w3 of the assist pattern 152 may be substantially ¹⁄₁₀ to ¼ of the first width w1 of the pixel pattern 111. When a third width w3 of the assist pattern 152 is uniform across the assist pattern 152, an end portion of the pixel or circuit pattern of the display apparatus formed by the pixel pattern 111 may be designed to have a proper size. The second height h2 and the third width w3 affect each other, and may be controlled based on a relationship of the second height h2 and the third width w3 to each other. In one exemplary embodiment, for example, when the second height h2 is increased, the third width w3 may be reduced. Alternatively, when the second height h2 is decreased, the third width w3 may be increased.

The assist pattern 152 may block a light used for exposing the substrate and the materials thereon to form the pixel or circuit pattern of a display apparatus. A size of the assist pattern 152 may be smaller than a size of the pixel pattern 111, and a pixel pattern or a circuit pattern of the display substrate is not substantially formed by the assist pattern 152. Since only an amount of light provided to a pattern of the mask adjacent to the assist pattern 151 may be reduced, pixel and/or circuit patterns of a display apparatus may be easily designed to have a proper shape by using the assist pattern 152.

The assist pattern 152 is extended from an end portion of the pixel pattern 111. The assist pattern 152 with the pixel pattern 111 may be integrally formed, such that the assist pattern 152 and the pixel pattern 111 form a single, unitary, indivisible member. A pixel and/or circuit pattern of a display apparatus is not substantially formed by the assist pattern 152. Forming a pixel and/or circuit pattern of the display apparatus at an end portion of the pixel pattern 111 is affected by the assist pattern 152. The assist pattern 152 serves to control an amount of light provided to the material at an end portion of the pixel pattern 111 of the mask. Particularly, a light leaked from a circuit area 102 may be blocked by the assist pattern 152. Thus, the assist pattern 152 serves to form a design of a pattern of the pixel and/or circuit pattern of the display apparatus at an end portion of the pixel pattern 111.

Figure 7:
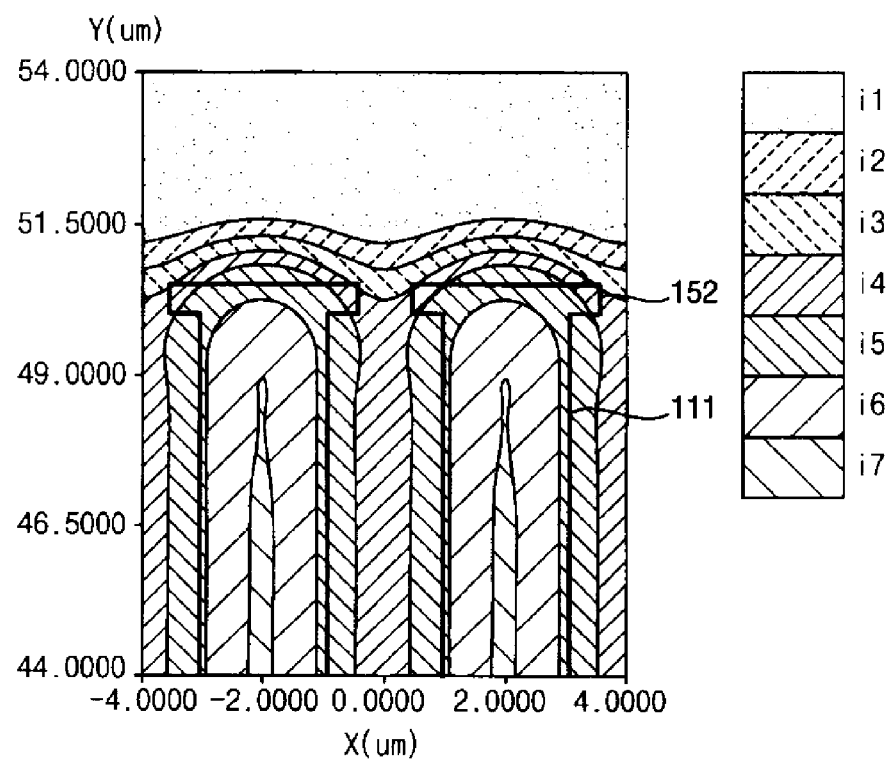
FIG. 7 is a graph illustrating an exposure intensity of the mask shown in FIG. 6.

FIG. 7 is a graph illustrating an exposure intensity of the mask shown in FIG. 6.

Referring to FIG. 7, an exposure intensity of the exemplary embodiment of the mask in FIG. 6 is illustrated. The X and Y axes are dimensions in microns (μm) of ribs of the pixel electrode 110 adjacent to the circuit area 102. FIG. 7 represents an exposure intensity of an exemplary embodiment of a mask according to the invention when the third width w3 is 3.0 μm, the second height h2 is 0.5 μm and the first width w1 is 2.0 μm.

Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the sixth intensity i6 and the seventh intensity i7. A pixel pattern (e.g., pixel electrode 110) is formed to have a U-type pattern (e.g., not a serpentine pattern). Thus, an electric field necessary for liquid crystal arrangement may be substantially the same as other pixel electrode patterns, thus a defect by a pixel electrode pattern may be reduced or effectively prevented.

Figure 8:
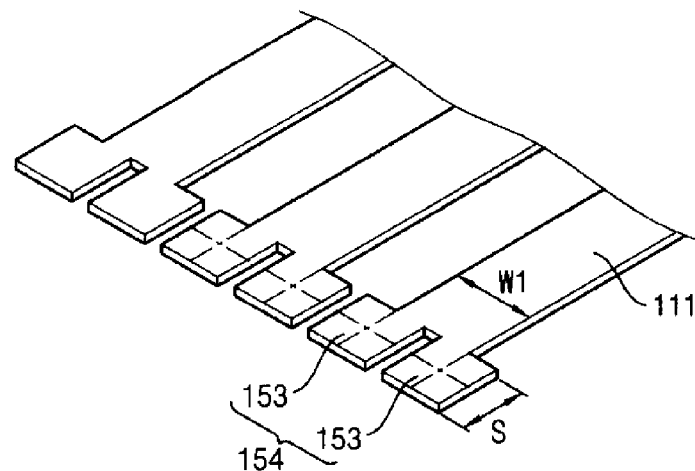
FIG. 8 is a perspective view illustrating another exemplary embodiment of a portion of mask according to the invention.

FIG. 8 is a perspective view illustrating another exemplary embodiment of a portion of mask according to the invention.

Referring to FIG. 8, a mask may include a pixel pattern 111, and an assist pattern 154 extended from an end portion of the pixel pattern 111. The assist pattern 154 may include at least two sub-assist patterns 153. The sub-assist patterns 153 are respectively extended from distal corners of the pixel pattern 111. Each sub-assist pattern 153 may include a square planar shape, but is not limited thereto or thereby. When the sub-assist pattern 153 is formed to have a square shape, a length of a side of the square shape of the sub-assist pattern may be substantially equal to a first length 's'.

The pixel pattern 111 may include a first width w1. The sub-assist pattern 153 may include a first length 's'. Twice a first length 's' of the sub-assist pattern 153 may be smaller than about 75% of the first width w1 of the pixel pattern 111. When twice the first length 's' of the sub-assist pattern 153 is greater than a first width w1 of the pixel pattern 111, an additional pixel and/or circuit pattern is formed from material on a substrate by the sub-assist pattern 153, and thus adjacent patterns formed at an end portion of the pixel pattern 111 may generate a short-circuit. Thus, twice a first length 's' of the sub-assist pattern 153 having square shape is no more than about 75% of a first width w1 of the pixel pattern 111.

In one exemplary embodiment, twice a first length 's' of the sub-assist pattern 153 may be substantially equal to or greater than about 50% of the first width w1 of the pixel pattern 111 and may be substantially equal to or smaller than about 70% of the first width w1 of the pixel pattern 111. When the sub-assist pattern 153 has the square shape, and when twice the first length 's' of the sub-assist pattern 153 is substantially equal to or greater than about 50% of the first width w1 of the pixel pattern 111 and substantially equal to or smaller than about 70% of the first width w1 of the pixel pattern 111, an end portion of the pixel pattern 111 may be effectively designed. Hereinafter, together with experiment data, the pixel pattern 111 with respect to a first length 's' of a square-shaped sub-assist pattern 153 is illustrated.

The sub-assist pattern 153 with the pixel pattern 111 may be integrally formed, such that the assist pattern 153 and the pixel pattern 111 form a single, unitary, indivisible member. Since the sub-assist pattern 153 is extended from an end portion of the pixel pattern 111, other elements of the mask may not be necessary, and the sub-assist pattern 153 may be designed on an end portion of the pixel pattern 111 to form a design of a pixel and/or circuit pattern of a display apparatus. A center of the square shape of the sub-assist pattern 153 is formed on an extension line extended in the length direction of the pixel pattern 111. As illustrated in FIG. 8, the extension line extends from an outer edge of the pixel pattern 111, and the center of the square shape of the sub-assist pattern 153 is on this extension line. In order that the assist pattern 154 is designed to provide a proper pattern of an end portion of the pixel pattern 111, the sub-assist pattern 153 is disposed in corners of the pixel pattern 111 at a distal end of the pixel pattern 111. When the sub-assist pattern 153 is formed to have a square shape, the sub-assist pattern 153 may be arranged such that the center of the square shape is disposed on an imaginary line extended from a side of the pixel pattern 111.

The assist pattern 154 may block a light used for exposing the substrate and the material thereon to form the pixel and/or circuit pattern of a display apparatus. A size of the assist pattern 154 may be smaller than size of the pixel pattern 111, and a pixel pattern or a circuit pattern of the display apparatus is not substantially formed by the assist pattern 154. Since only amount of light provided to a pattern of the mask adjacent to the assist pattern 154 may be reduced, pixel and/or circuit patterns of the display apparatus may be easily designed to have a proper shape by using the assist pattern 154.

The assist pattern 154 is extended from an end portion of the pixel pattern 111. The assist pattern 154 may include at least two sub-assist patterns 153. The sub-assist pattern 153 is extended from corners of the pixel pattern 111. The sub-assist pattern 153 with the pixel pattern 111 may be integrally formed. A pixel and/or circuit pattern of the display substrate is not substantially formed by the assist pattern 154. Forming a pixel and/or circuit pattern of a display apparatus at an end portion of the pixel pattern 111 is affected by the assist pattern 154. The assist pattern 154 serves to control an amount of light provided to the material at an end portion of the pixel pattern 111. Particularly, a light leaked light from a circuit area 102 may be blocked by the assist pattern 154. Thus, the assist pattern 154 serves to form an initial design of a pattern of the pixel and/or circuit pattern of the display apparatus at an end portion of the pixel pattern 111.

Figure 9:
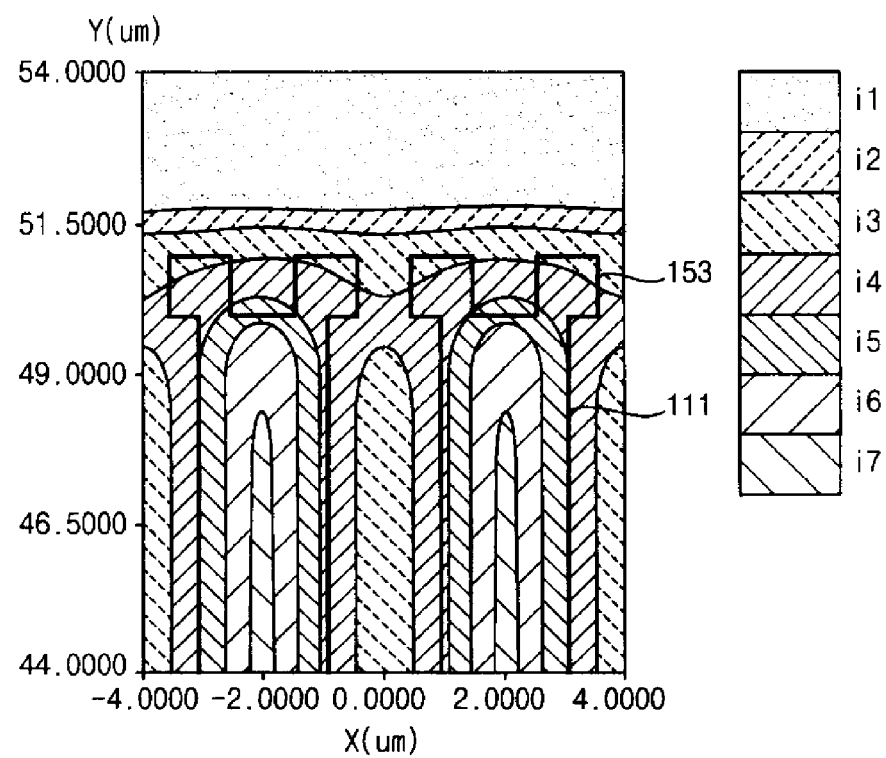
FIG. 9 is a graph illustrating an exposure intensity of the mask shown in FIG. 8.

FIG. 9 is a graph illustrating an exposure intensity of the mask shown in FIG. 8.

Referring to FIG. 9, an exposure intensity of the exemplary embodiment of the mask in FIG. 8 is illustrated. The X and Y axes are dimensions in microns (μm) of ribs of the pixel electrode 110 adjacent to the circuit area 102. FIG. 9 represents an exposure intensity of an exemplary embodiment of a mask according to the invention when twice the first length s is 1.0 μm and the first width w1 is 2.0 μm.

Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the fifth intensity i5, the sixth intensity i6 and the seventh intensity i7. A pixel pattern (e.g., pixel electrode 110) is formed to have a U-type pattern (e.g., not a serpentine pattern). Thus, an electric field necessary for liquid crystal arrangement may be substantially the same as other pixel electrode patterns, thus a defect by a pixel electrode pattern may be reduced or effectively prevented.

FIGS. 10A to 10F are graphs illustrating a relationship between an exposure intensity of the mask and a size of the sub-assist pattern shown in FIG. 8.

FIGS. 10A to 10F are graphs illustrating an intensity of a light which is exposed by the mask with respect to a first length 's' of the sub-assist pattern.

Figure 10A:
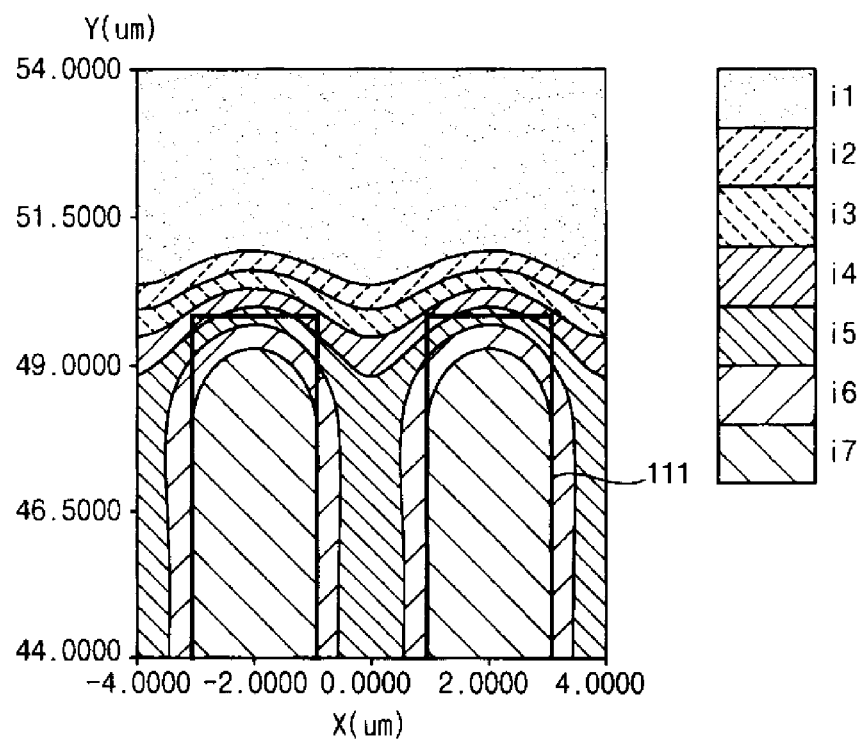
FIGS. 10A to 10F are graphs illustrating a relationship between an exposure intensity of the mask and a size of the sub-assist pattern shown in FIG. 8.

FIG. 10A illustrates an intensity of light exposed by the exemplary embodiment of the mask in FIG. 8, when the sub-assist pattern has a square shape on an end portion of the pixel pattern 111. A first length 's' of a side of the square shape is zero. A first width w1 of the pixel pattern 111 is 4 μm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. In FIG. 10A, the intensity of the light is provided such that a pixel pattern of a display apparatus is not formed at an end portion of the pixel pattern 111. Thus, a pixel pattern of the display apparatus is not formed to have a proper shape.

Figure 10B:
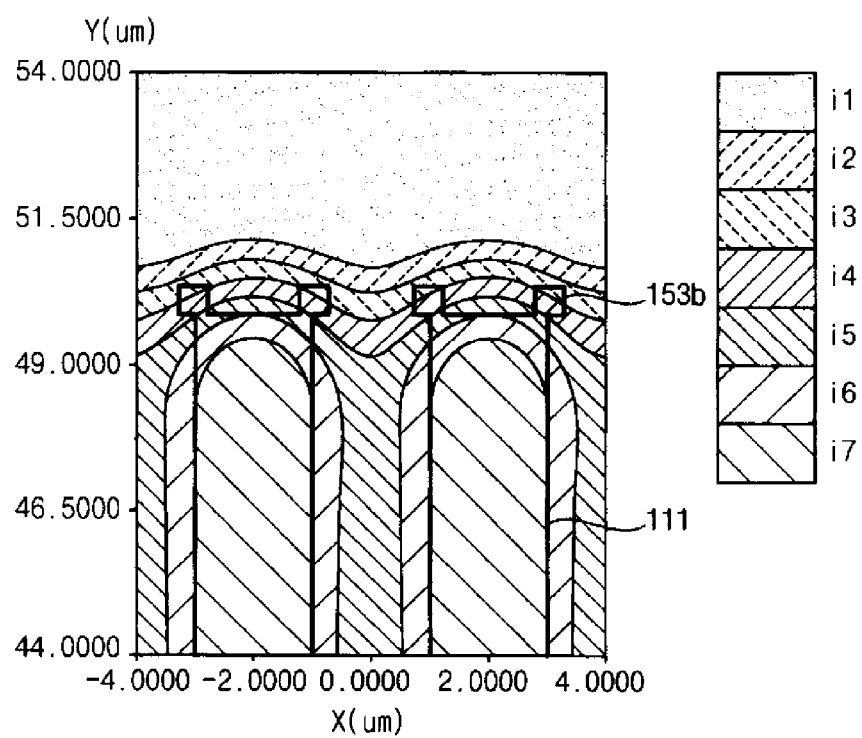

FIG. 10B illustrates an intensity of light exposed by the exemplary embodiment of the mask in FIG. 8, when the sub-assist pattern 153b has a square shape on an end portion of the pixel pattern 111. Twice a first length 's' of a side of the square is about 25% of a first width w1 of the pixel pattern 111. A first width w1 of the pixel pattern 111 is 4 μm. Thus, twice the first length 's' is about 0.5 μm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. In FIG. 10B, the intensity of the light is provided such that a pixel pattern of a display apparatus is not formed on an end portion of the pixel pattern 111. Thus, a pixel pattern of the display apparatus is not formed to have a proper shape.

Figure 10C:
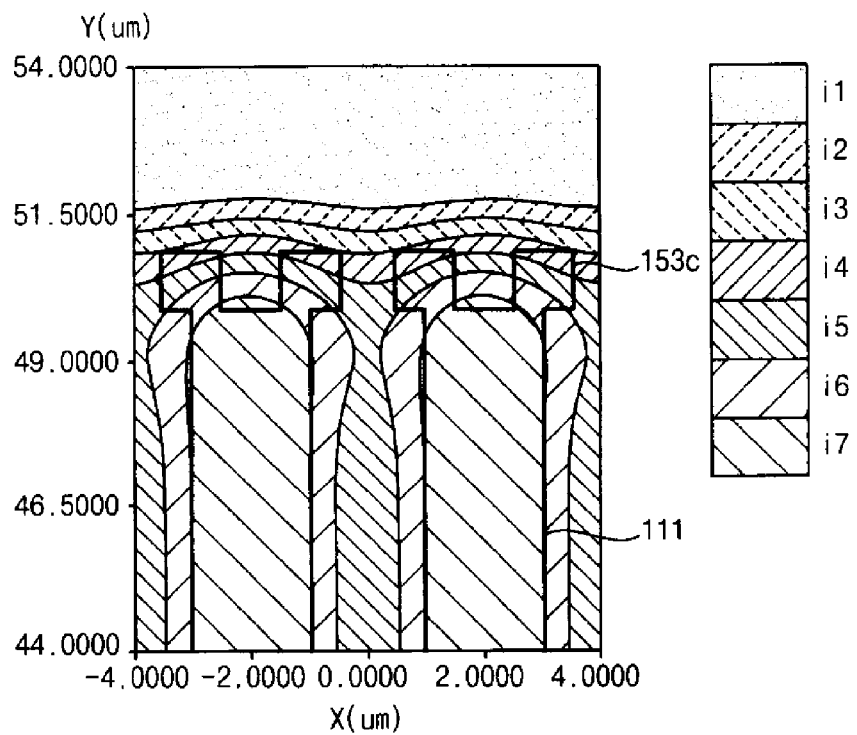

FIG. 10C illustrates an intensity of light exposed by the exemplary embodiment of the mask in FIG. 8, when the sub-assist pattern 153c has a square shape on an end portion of the pixel pattern 111. Twice a first length 's' of a side of the square is about 50% of a first width w1 of the pixel pattern 111. A first width w1 of the pixel pattern 111 is 4 µm. Thus, twice the first length 's' is about 1.0 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is only formed on an area which is irradiated by the seventh intensity i7. In FIG. 10C, the intensity of the light is provided such that a pixel pattern of a display apparatus is formed on an end portion of the pixel pattern 111. Thus, when twice the first length 's' is at least about 50% of a first width w1 of the pixel pattern 111, a pixel pattern of the display apparatus may be formed to have a proper shape.

Figure 10D:
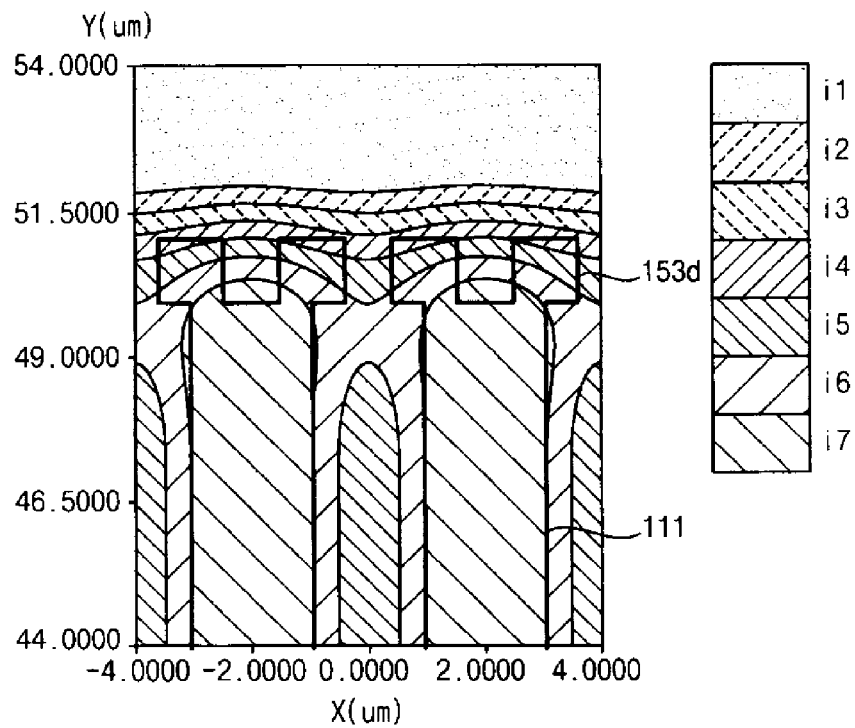

FIG. 10D illustrates an intensity of light exposed by the exemplary embodiment of the mask in FIG. 8, when the sub-assist pattern 153d has a square shape on an end portion of the pixel pattern 111. Twice a first length 's' of a side of the square shape is about 55% of a first width w1 of the pixel pattern 111. A first width w1 of the pixel pattern 111 is 4 µm. Thus, twice the first length 's' is about 1.1 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is only formed on an area which is irradiated by the seventh intensity i7. In FIG. 10D, the intensity of light is provided such that a pixel pattern of a display apparatus is formed on an end portion of the pixel pattern 111. Thus, when twice the first length 's' is equal to about 55% of a first width w1 of the pixel pattern 111, a pixel pattern of the display apparatus may be formed to have a proper shape.

Figure 10E:
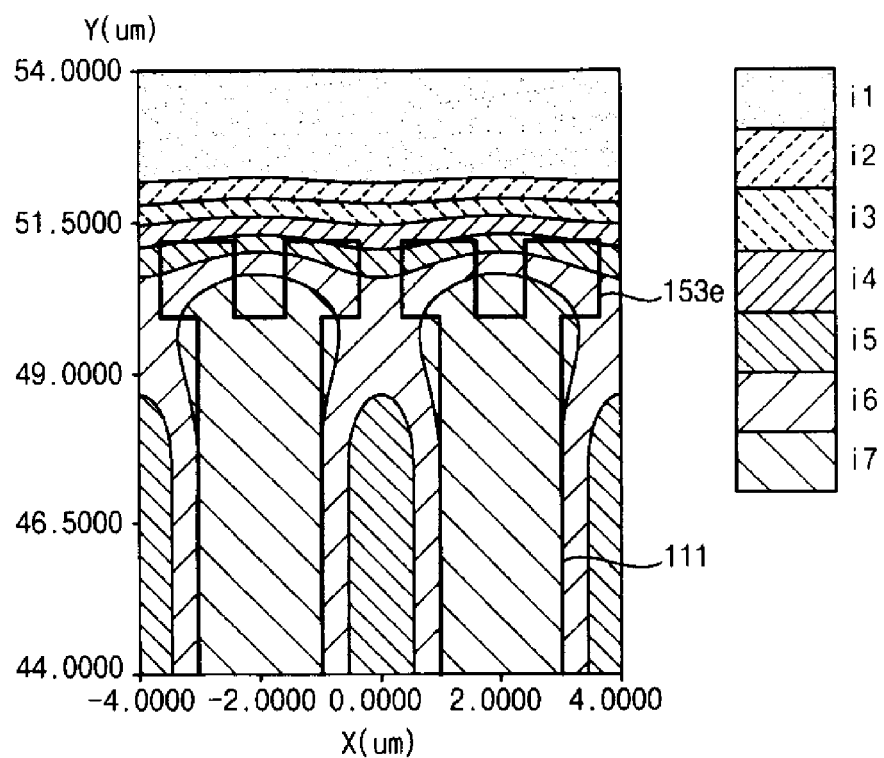

FIG. 10E illustrates an intensity of light exposed by the exemplary embodiment of the mask in FIG. 8, when the sub-assist pattern 153e has a square shape on an end portion of the pixel pattern 111. Twice a first length 's' of a side of the square shape is about 62.5% of a first width w1 of the pixel pattern 111. A first width w1 of the pixel pattern 111 is 4 µm. Thus, twice the first length 's' is about 1.25 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. In FIG. 10E, the intensity of the light is provided such that a pixel pattern of a display apparatus is formed on an end portion of the pixel pattern 111. Thus, when twice the first length 's' is about 62.5% of a first width w1 of the pixel pattern 111 a pixel pattern of the display apparatus may be formed to have a proper shape.

Figure 10F:
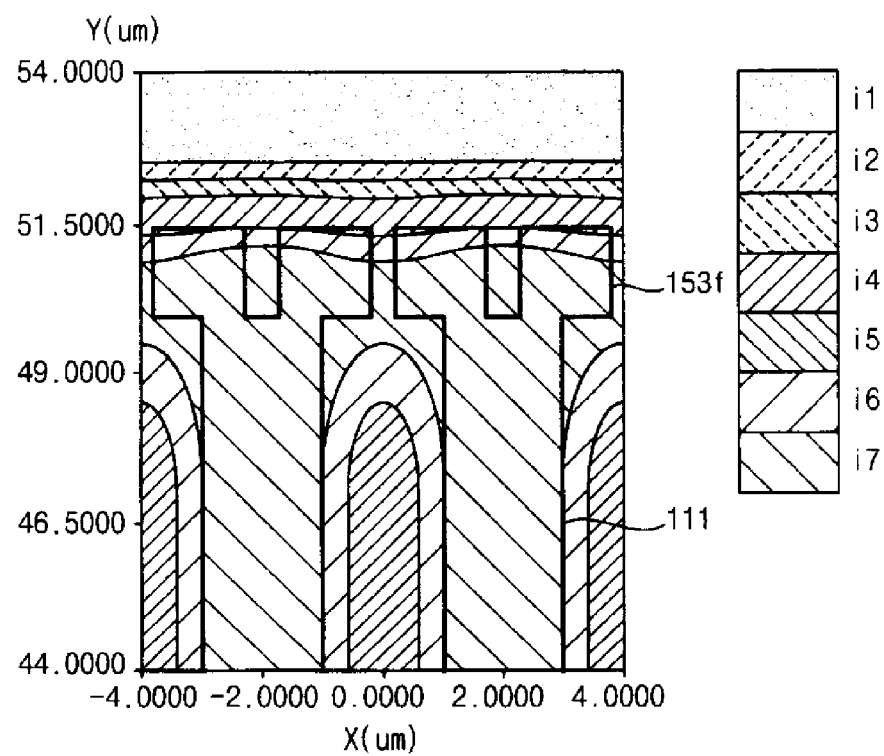

FIG. 10F illustrates an intensity of light exposed by the exemplary embodiment of the mask in FIG. 8, when the sub-assist pattern 153f has a square shape on an end portion of the pixel pattern 111. Twice a first length 's' of a side of the square shape is about 75% of a first width w1 of the pixel pattern 111. A first width w1 of the pixel pattern 111 is 4 µm. Thus, twice the first length 's' is about 1.5 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. FIG. 10F shows end portions of adjacent pixel patterns of a display substrate which contact each other. Since an electrical short-circuit is generated by the adjacent pixel patterns, a necessary electric field is not formed by the pixel pattern (e.g., pixel electrode 110), so that defect is generated in a pixel of the display apparatus including the pixel pattern. Thus, when twice the first length 's' is about 75% of a first width w1 of the pixel pattern 111, a defect of an end portion of the pixel pattern extended in a side direction and outward is generated. Thus, a pixel pattern of the display apparatus may not have a proper shape.

FIGS. 11A to 11F are graphs further illustrating an intensity of a light exposed by the mask with respect to a size of the sub-assist pattern shown in FIG. 8.

FIGS. 11A to 11F are graphs illustrating different first lengths 's' of the sub-assist pattern with respect to an exposure intensity of light on the exemplary embodiment of the mask in FIG. 8. The graphs in FIGS. 11A to 11F differ from the graphs in FIGS. 10A to 10F in that a first width w1 of the pixel pattern 111 in FIGS. 10A to 10F is smaller than in FIGS. 11A to 11F.

Figure 11A:
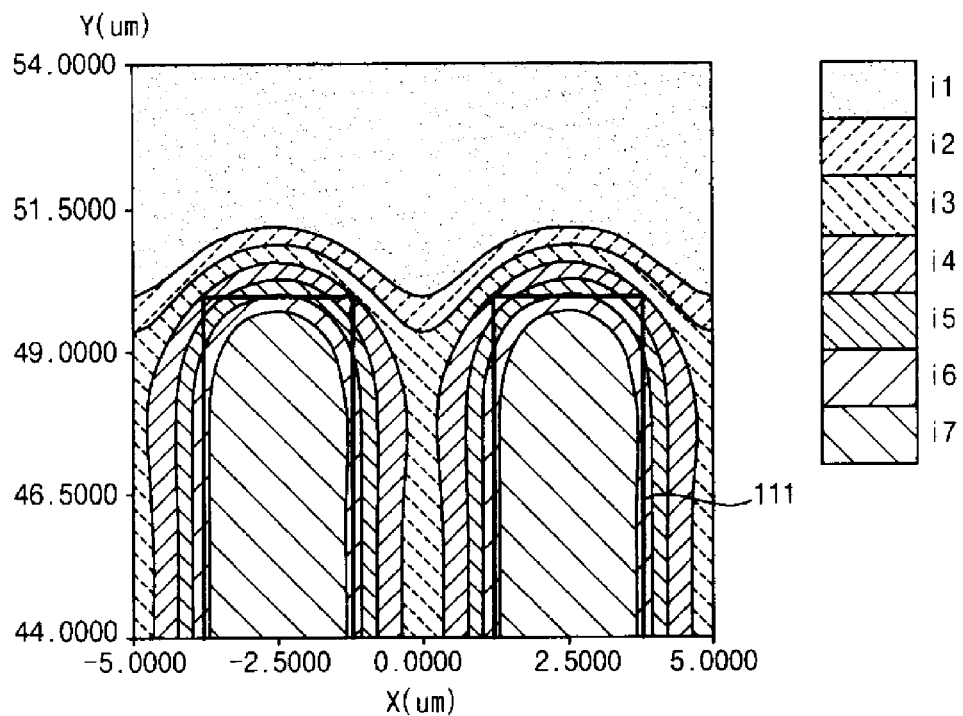
FIGS. 11A to 11F are graphs further illustrating a relationship between an exposure intensity of the mask and a size of the sub-assist pattern shown in FIG. 8.

FIG. 11A illustrates an intensity of light exposed by the exemplary embodiment of the mask in FIG. 8, when the sub-assist pattern has a square shape on an end portion of the pixel pattern 111. A first length 's' of a side of the square is zero. A first width w1 of the pixel pattern 111 is 5 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. In FIG. 11A, the intensity of the light is provided such that a pixel pattern of a display apparatus is not formed on an end portion of the pixel pattern 111. Thus, a pixel pattern of the display substrate may be not formed to have a proper shape.

Figure 11B:
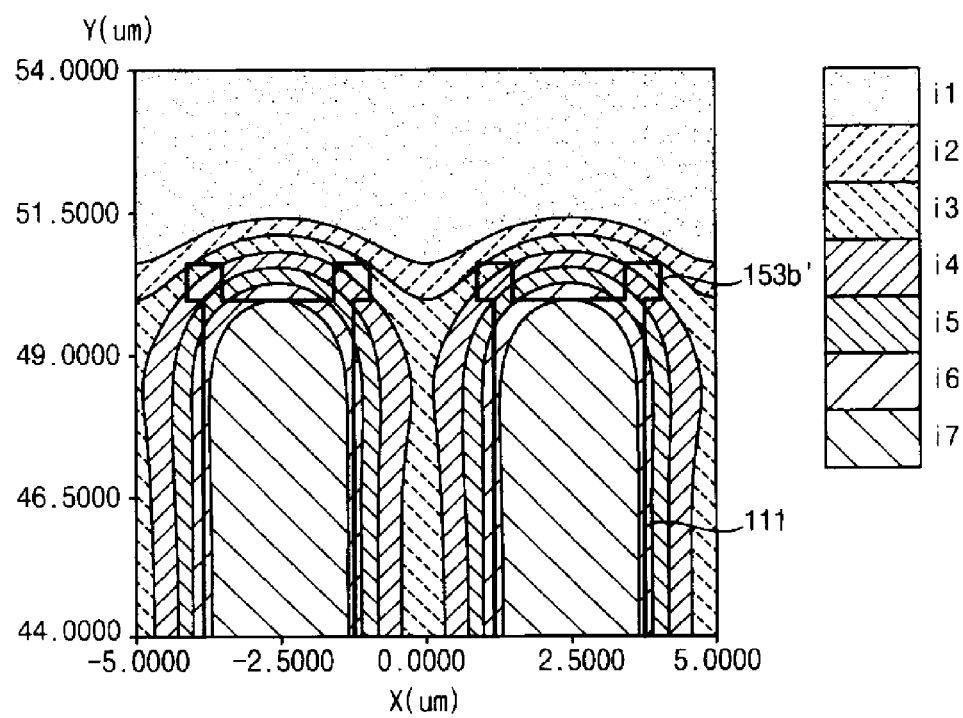

FIG. 11B illustrates an intensity of light exposed by the exemplary embodiment of the mask in FIG. 8, when the sub-assist pattern 153b' has a square shape on an end portion of the pixel pattern 111. Twice a first length 's' of a side of the square is about 25% of a first width w1 of the pixel pattern 111. A first width w1 of the pixel pattern 111 is 5 µm. Thus, twice the first length 's' is about 0.625 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area where is irradiated by the seventh intensity i7. In FIG. 11B, the intensity of the light is provided such that a pixel pattern of a display apparatus is not formed on an end portion of the pixel pattern 111. Thus, a pixel pattern of the display substrate may be not formed to have a proper shape.

Figure 11C:
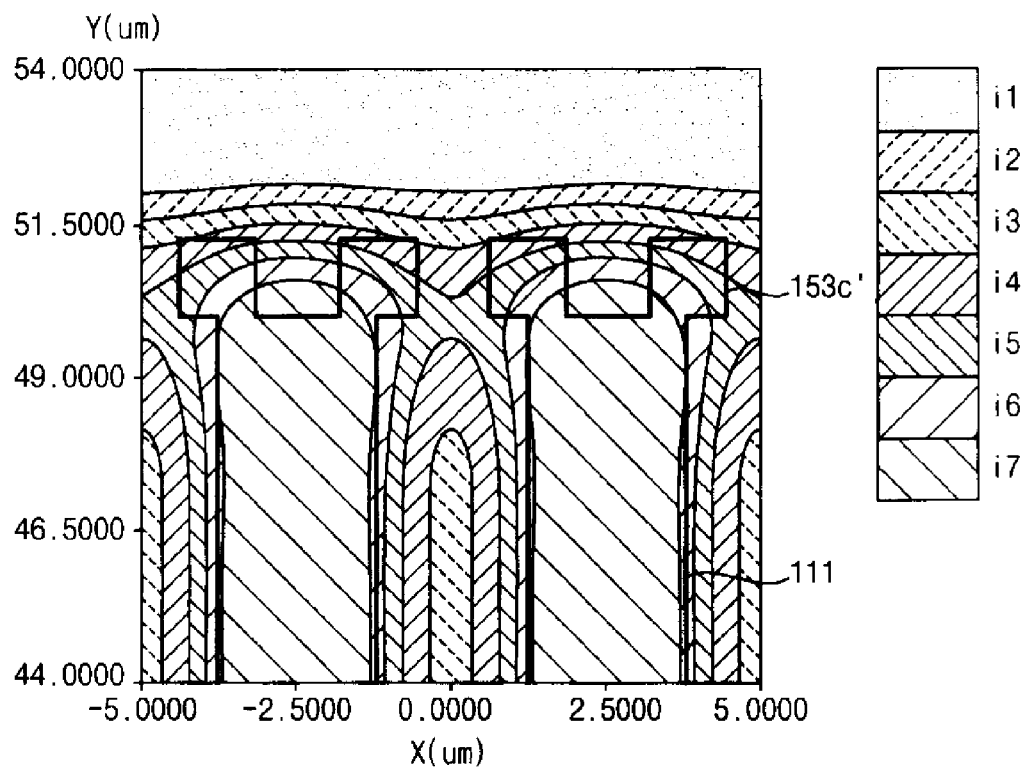

FIG. 11C illustrates an intensity of light exposed by the exemplary embodiment of the mask in FIG. 8, when the sub-assist pattern 153c' has a square shape on an end portion of the pixel pattern 111. Twice a first length 's' of a side of the square is about 50% of a first width w1 of the pixel pattern 111. A first width w1 of the pixel pattern 111 is 5 µm. Thus, twice the first length s is about 1.25 µm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area where is irradiated by the seventh intensity i7. In FIG. 11C, the intensity of light is provided such that a pixel pattern of a display substrate is formed on an end portion of the pixel pattern 111. Thus, when twice the first length 's' is at least 50% of a first width w1 of the pixel pattern 111, a pixel pattern of the display substrate may be formed to have a proper shape.

Figure 11D:
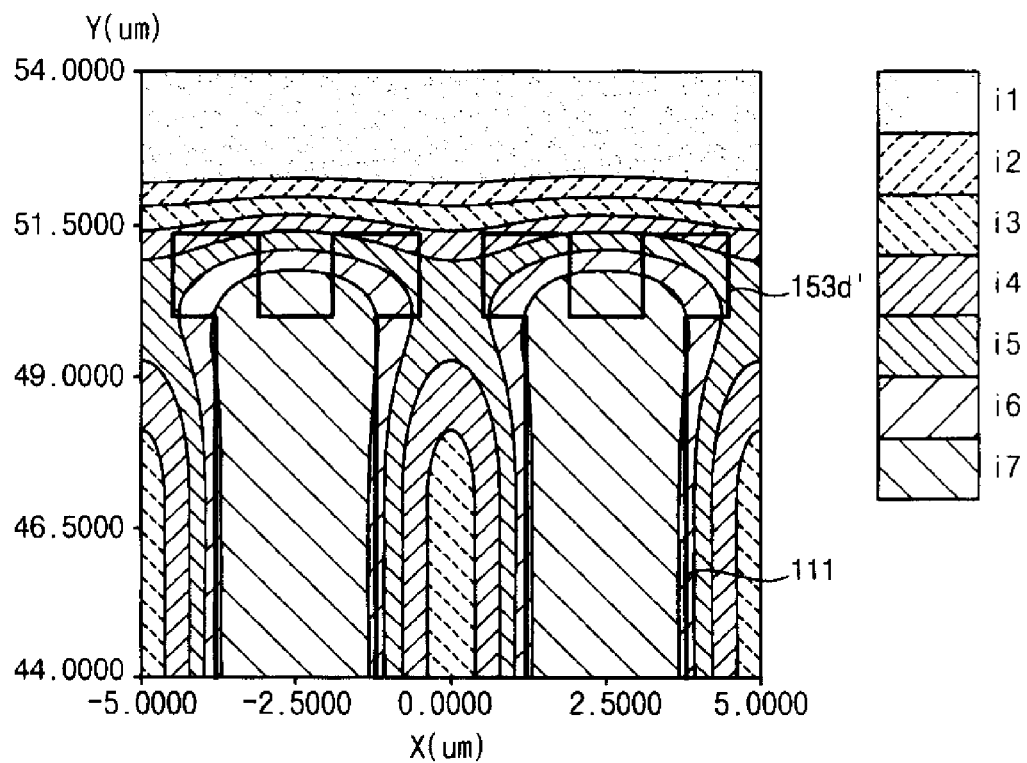

FIG. 11D illustrates an intensity of light exposed by the exemplary embodiment of the mask in FIG. 8, when the sub-assist pattern 153d' has square shape on an end portion of the pixel pattern 111. Twice a first length 's' of a side of the square is about 55% of a first width w1 of the pixel pattern 111. A first width w1 of the pixel pattern 111 is 5 μm. Thus, twice the first length 's' is about 1.375 μm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area where is irradiated by the seventh intensity i7. In FIG. 11D, the intensity of the light is provided such that a pixel pattern of a display substrate is formed on an end portion of the pixel pattern 111. Thus, when twice the first length 's' is equal to about 55% of a first width w1 of the pixel pattern 111, a pixel pattern of the display substrate may be formed to have a proper shape.

Figure 11E:
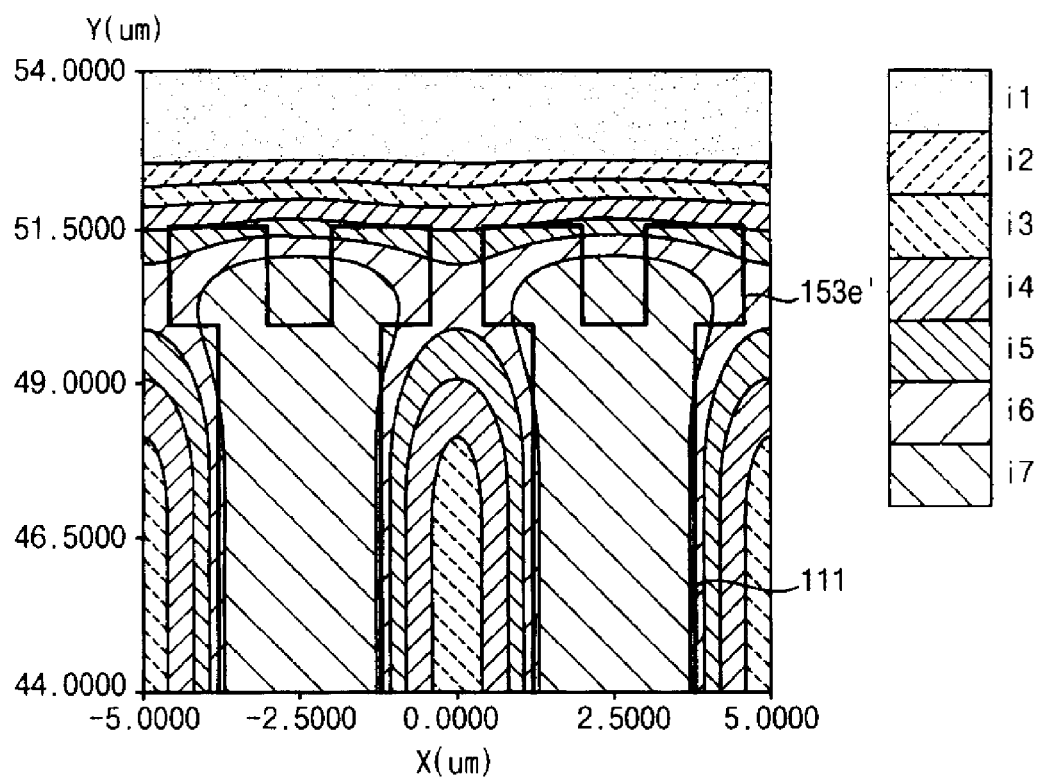

FIG. 11E illustrates an intensity of light exposed by the exemplary embodiment of the mask in FIG. 8, when the sub-assist pattern 153e' has a square shape on an end portion of the pixel pattern 111. Twice a first length 's' of a side of the square is about 62.5% of a first width w1 of the pixel pattern 111. A first width w1 of the pixel pattern 111 is 5 μm. Thus, twice the first length 's' is 1.56 μm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. In FIG. 11E, the intensity of the light is provided such that a pixel pattern of a display apparatus is formed on an end portion of the pixel pattern 111. Thus, when twice the first length 's' is about 62.5% of a first width w1 of the pixel pattern 111, a pixel pattern of the display substrate may be formed to have a proper shape.

Figure 11F:
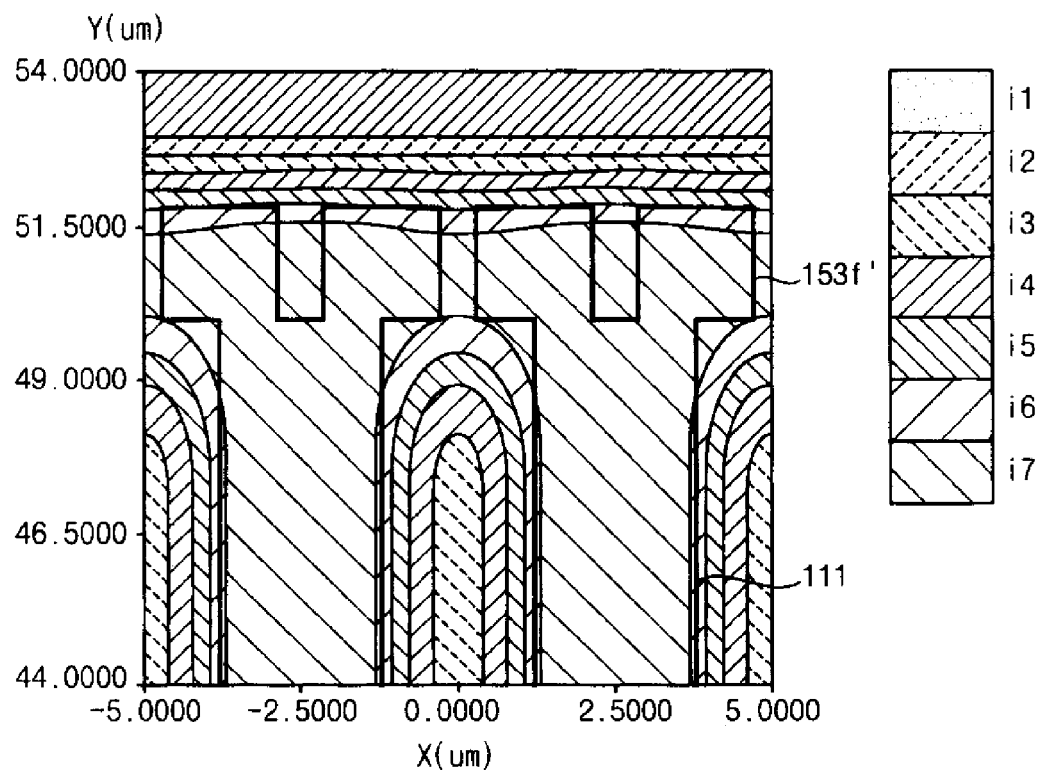

FIG. 11F illustrates an intensity of light exposed by the exemplary embodiment of the mask in FIG. 8, when the sub-assist pattern 153f' has a square shape on an end portion of the pixel pattern 111. Twice a first length 's' of a side of the square is about 75% of a first width w1 of the pixel pattern 111. A first width w1 of the pixel pattern 111 is 5 μm. Thus, twice the first length 's' is about 1.875 μm. Intensity of a light is illustrated as a first intensity i1, a second intensity i2, a third intensity i3, a fourth intensity i4, a fifth intensity i5, a sixth intensity i6 and a seventh intensity i7. A pattern from material on a substrate is formed only on an area which is irradiated by the seventh intensity i7. FIG. 11F shows end portions of adjacent pixel patterns of a display substrate which contact each other. Since an electrical short-circuit is generated by the adjacent pixel patterns, a necessary electric field is not formed by the pixel pattern (e.g., pixel electrode 110), so that defect is generated in a pixel of the display apparatus including the pixel pattern. Thus, when twice the first length 's' is about 75% of a first width w1 of the pixel pattern 111, a defect of an end portion of the pixel pattern extended in a side direction and outward is generated. Thus, a pixel pattern of the display apparatus may not be formed to have a proper shape. A similar result is observed when a first width w1 of the pixel pattern 111 is 4 μm.

A first length 's' of the sub-assist pattern 153 is determined by a first width w1 of the pixel pattern 111. Particularly, twice the first length 's' is smaller than at least 75% of the first width w1. In one exemplary embodiment, twice the first length 's' may be equal to or greater than about 50% of the first width w1 and may be equal to or smaller than about 75% of the first width w1.

Figure 12:
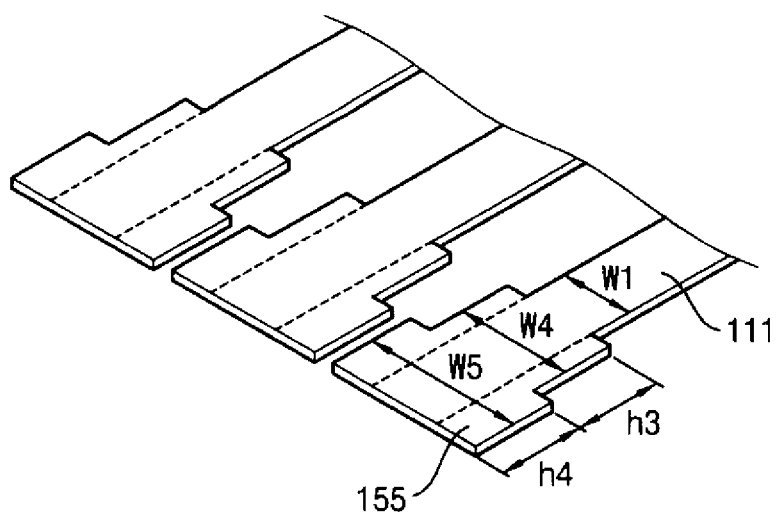
FIG. 12 is a perspective view illustrating another exemplary embodiment of a portion of mask according to the invention.

FIG. 12 is a perspective view illustrating another exemplary embodiment of a portion of mask according to the invention.

Referring to FIG. 12, a mask may include a pixel pattern 111, and an assist pattern 155 formed extending from a side of the pixel pattern 111. In a plan view, the assist pattern 155 may have a stepped shape. The pixel pattern 111 may include a first width w1. The assist pattern 155 may include a fourth width w4 and a fifth width w5. An area having the fourth width w4 may include a third height h3 taken in a length direction of the pixel pattern 111. An area having the fifth width w5 may include a fourth height h4 taken in the length direction of the pixel pattern 111. The assist pattern 155 may include a width which decreases as a distance from the end portion of the pixel pattern 111 decreases. The assist pattern 155 may include irregular width (e.g., the stepped shape), but is not limited thereto or thereby. Alternatively, the width of the assist pattern 155 may constantly change as the distance from the end portion of the pixel pattern 111 decreases, to include a regularly changing width.

A third height h3 and a fourth height h4 of the assist pattern 155 is variously formed based on an exposure intensity and a first width of the pixel pattern 111. The assist pattern 155 is adjacent to a side of the pixel pattern 111 as indicated by the outer edge dotted lines in FIG. 12. Thus, an end portion of the pixel pattern 111 may include a larger width due to the assist pattern 155, so that an end portion of the pixel pattern 111 may be designed according to a final shape of a pattern of a display apparatus. Alternatively, a width of the assist pattern 155 and the pixel pattern 111 may be increased, as a distance from the end portions may be linearly decreased.

The assist pattern 155 may block a light used for exposing a substrate and a material thereon to form a pixel and/or circuit pattern of a display apparatus. A size of the assist pattern 154 may be smaller than the pixel pattern 111, and a pixel pattern or a circuit pattern of the display apparatus is not substantially formed by the assist pattern 155. Since only an amount of light provided to a pattern of the mask adjacent to the assist pattern may be reduced, pixel and/or circuit patterns of the display apparatus may be easily designed to have a proper shape by the assist pattern 155.

In the exemplary embodiment of FIG. 12, the assist pattern 155 is extended from a side of the pixel pattern 111. The assist pattern 155 and the pixel pattern 111 may be integrally formed such that the assist pattern 155 and the pixel pattern 111 form a single, unitary, indivisible member. A pixel and/or circuit pattern of the display apparatus is not formed by the assist pattern 155. Forming a pixel and/or circuit pattern of the display apparatus at an end portion of the pixel pattern 111 is affected by the assist pattern 155. The assist pattern 155 serves to control an amount of provided light to an end portion of the pixel pattern 111 of the mask. Particularly, a light leaked from a circuit area 102 may be blocked by the assist pattern 155. Thus, the assist pattern 155 serves to form a design of an pattern of the pixel and/or circuit pattern of the display apparatus at an end portion of the pixel pattern 111.

According to one or more exemplary embodiment of the invention, an assist pattern of a mask disposed at an end portion of a pixel pattern of mask and disposed adjacent to a circuit area blocks light from being incident into a pixel area from the circuit area. Thus, an end portion of a pixel pattern of a display apparatus may be easily designed to have a proper shape by using the mask having both a pixel pattern and an assist pattern.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications, are intended to be included within the scope of the appended claims. The invention is defined by the following claims, with equivalents of the claims to be included therein.

What is claimed is:

1. A mask comprising:
   a circuit area comprising a circuit pattern; and
   a pixel area comprising:
      a pixel pattern extended in a length direction; and
      an assist pattern adjacent to the circuit area, the assist pattern connected to and extended from an end portion of the pixel pattern,
      wherein
      the assist pattern connected to and extended from the end portion of the pixel pattern comprises two sub-assist patterns extended from corners of the end portion of the pixel pattern, each of the sub-assist patterns having a square shape.

2. The mask of claim 1, wherein a center of the square shape of the sub-assist pattern is on an extension line extended in the length direction of the pixel pattern.

3. The mask of claim 1, wherein twice a length of a side of the square shape of the sub-assist pattern is substantially equal to or smaller than about 75% of a width of the pixel pattern.

4. The mask of claim 1, wherein twice a length of a side of the square of the sub-assist pattern is substantially equal to or greater than about 50% of a width of the pixel pattern and is substantially equal to or smaller than about 70% of the width of the pixel pattern.

5. The mask of claim 1, wherein the sub-assist pattern is integral with the pixel pattern.

6. The mask of claim 1, wherein a width of the assist pattern is greater than a width of the pixel pattern.

7. The mask of claim 6, wherein a height of the assist pattern extended in the length direction of the pixel pattern is about 1/10 to about 1/4 the width of the pixel pattern.

8. The mask of claim 6, wherein the width of the assist pattern is greater than the width of the pixel pattern by about 1/10 to about 1/4 of the pixel pattern.

9. The mask of claim 6, wherein the assist pattern is integral with the pixel pattern.

10. The mask of claim 1, wherein the assist pattern is extended from a side of the pixel pattern.

11. The mask of claim 10, wherein a thickness of the assist pattern is increased, as a distance from the end portion of the pixel pattern is decreased.

12. The mask of claim 10, wherein a thickness of the assist pattern is discontinuously increased, as a distance from the end portion of the pixel pattern is decreased.

* * * * *